(12) United States Patent
Shah et al.

(10) Patent No.: US 7,677,052 B2
(45) Date of Patent: Mar. 16, 2010

(54) SYSTEMS FOR IMPROVED PASSIVE LIQUID COOLING

(75) Inventors: Ketan R. Shah, Olympia, WA (US); Russell S. Aoki, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 1323 days.

(21) Appl. No.: 11/091,267

(22) Filed: Mar. 28, 2005

(65) Prior Publication Data
US 2006/0213211 A1 Sep. 28, 2006

(51) Int. Cl.
*F25D 23/12* (2006.01)
(52) U.S. Cl. .................................................. 62/259.2
(58) Field of Classification Search ................ 62/259.2; 165/104.21; 257/713, 715, 722, 731
See application file for complete search history.

(56) References Cited

U.S. PATENT DOCUMENTS

| | | | | | |
|---|---|---|---|---|---|
| 2,883,591 | A | * | 4/1959 | Camp | 257/715 |
| 3,971,435 | A | * | 7/1976 | Peck | 165/78 |
| 4,036,291 | A | * | 7/1977 | Kobayashi et al. | 165/104.21 |
| 4,050,507 | A | | 9/1977 | Chu et al. | |
| 4,126,879 | A | * | 11/1978 | Kessler et al. | 257/580 |
| 4,633,371 | A | * | 12/1986 | Nagy et al. | 361/699 |
| 4,982,274 | A | | 1/1991 | Murase et al. | |
| 5,308,920 | A | | 5/1994 | Itoh | |
| 5,582,242 | A | * | 12/1996 | Hamburgen et al. | 165/104.21 |
| 5,880,524 | A | * | 3/1999 | Xie | 257/704 |
| 5,956,229 | A | * | 9/1999 | Brownell et al. | 361/699 |
| 6,381,135 | B1 | * | 4/2002 | Prasher et al. | 361/700 |
| 6,382,309 | B1 | * | 5/2002 | Kroliczek et al. | 165/104.26 |
| 6,397,618 | B1 | * | 6/2002 | Chu et al. | 62/259.2 |
| 6,410,982 | B1 | * | 6/2002 | Brownell et al. | 257/714 |
| 6,531,206 | B2 | * | 3/2003 | Johnston et al. | 428/172 |
| 6,694,416 | B1 | * | 2/2004 | Thomann et al. | 711/169 |
| 6,725,909 | B1 | | 4/2004 | Luo | |
| 6,793,009 | B1 | * | 9/2004 | Sarraf | 165/104.33 |

(Continued)

FOREIGN PATENT DOCUMENTS

GB 804 297 A 11/1958

OTHER PUBLICATIONS

"Heat Pipes Cool Chips", Electronic Packaging and Production, Cahners Publishing Co., Newton, Massachusetts, US, vol. 31, No. 8, Aug. 1991, p. 37, XP000252463, ISSN: 0013-4945.

(Continued)

*Primary Examiner*—Melvin Jones
(74) *Attorney, Agent, or Firm*—Buckley, Maschoff & Talwalkar LLC

(57) ABSTRACT

According to some embodiments, systems for improved passive liquid cooling may be provided. In some embodiments, a system may comprise an evaporator and a condenser. According to some embodiments, the evaporator may comprise a first side to receive heat, a second side, and one or more fins protruding from the second side. In some embodiments, the condenser may comprise an inner surface defining a cavity and one or more grooves, a first end coupled to the evaporator such that the one or more fins of the evaporator are disposed within the cavity, and a second end, wherein the one or more grooves extend at least partially between the first and second ends of the condenser.

19 Claims, 7 Drawing Sheets

U.S. PATENT DOCUMENTS

| | | | | |
|---|---|---|---|---|
| 6,827,133 | B1* | 12/2004 | Luo | 165/104.21 |
| 6,844,054 | B2* | 1/2005 | Whatley | 428/295.4 |
| 6,889,756 | B1* | 5/2005 | Hou | 165/104.33 |
| 6,986,383 | B2* | 1/2006 | Hsu | 165/104.26 |
| 7,013,957 | B2* | 3/2006 | Hsu | 165/104.26 |
| 7,028,759 | B2* | 4/2006 | Rosenfeld et al. | 165/104.26 |
| 7,032,653 | B1* | 4/2006 | Chang | 165/104.26 |
| 7,048,039 | B2* | 5/2006 | Sarraf | 165/104.21 |
| 7,051,794 | B2* | 5/2006 | Luo | 165/104.26 |
| 7,067,088 | B2* | 6/2006 | Le | 422/206 |
| 7,090,002 | B2* | 8/2006 | Connors et al. | 165/104.21 |
| 7,137,441 | B2* | 11/2006 | Hsu | 165/104.26 |
| 7,152,667 | B2* | 12/2006 | Mochizuki et al. | 165/104.34 |
| 5,632,158 | A1 | 5/2007 | Tajima | |
| 2001/0050164 | A1* | 12/2001 | Wagner et al. | 165/104.33 |
| 2002/0056907 | A1 | 5/2002 | Wada et al. | |
| 2003/0066628 | A1 | 4/2003 | Mochizuki et al. | |
| 2005/0011633 | A1* | 1/2005 | Garner et al. | 165/104.26 |
| 2005/0022975 | A1 | 2/2005 | Rosenfeld et al. | |

OTHER PUBLICATIONS

"PCT International Search Report of the International Searching Authority", mailed Jul. 20, 2006, for PCT/US2006/011507, 4pgs.

* cited by examiner

SYSTEMS FOR IMPROVED PASSIVE LIQUID COOLING

BACKGROUND

Passive liquid cooling devices such as heat pipes are often used to remove heat from electronic components. A Central Processing Unit (CPU) and/or other electronic component may, for example, transfer heat to one or more heat pipes. Liquid within the heat pipes may accept the heat and undergo a phase change (e.g., boil) as a result. The heat pipes may often be configured such that the heated vapor moves away from the electronic component and is cooled by transferring heat to a heat sink or other device. The cooling causes the vapor to return to a liquid state and the heat pipes may be configured such that the liquid flows back to an area near the electronic component to once again accept heat to continue the cooling cycle.

As electronic components continue to generate larger quantities of heat and the space available for cooling solutions continues to diminish, however, typical heat pipes and/or passive liquid cooling solutions may not be suitable for removing adequate amounts of heat from the electrical components.

DETAILED DESCRIPTION

Figure 1:
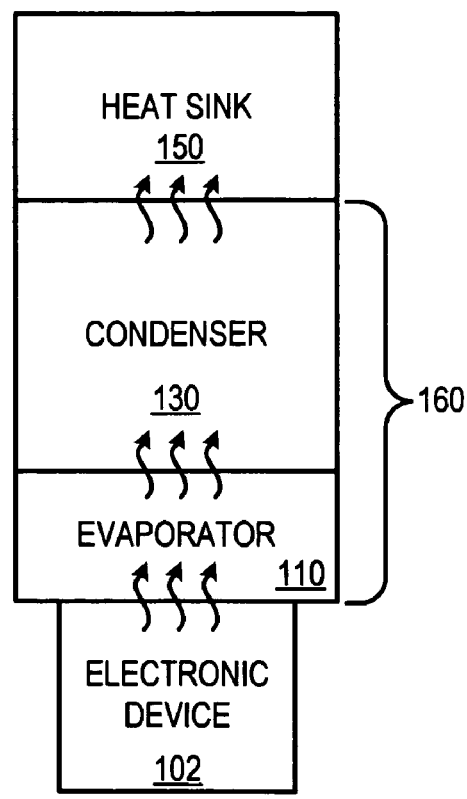
FIG. 1 is a block diagram of a system.

Referring first to FIG. 1, a block diagram of a system 100 is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.), an evaporator 110, a condenser 130, and/or a heat sink 150. In some configurations, the electronic device 102 may generate heat and/or may transfer heat to the evaporator 110. The evaporator 110 may, for example, be coupled to the electronic device 102 to accept and/or remove heat from the electronic device 102. Heat may travel through conduction, in some configurations, from the electronic device 102 to the evaporator 110 (e.g., as depicted via the wavy lines in FIG. 1).

In some configurations, the evaporator 110 may transfer heat to the condenser 130. For example, the evaporator 110 may transfer heat to a liquid in contact with the evaporator 110 and/or the condenser 130. The liquid may, for example, reside within a cavity (not shown in FIG. 1) defined by the evaporator 110 and/or the condenser 130. According to some configurations, the evaporator 110 may cause the liquid to undergo a phase change (e.g., from a liquid to a vapor) by transferring heat to the liquid. The heated vapor may then, for example, flow into and/or through the condenser 130 (e.g., as depicted via the wavy lines).

In some configurations, the heated vapor may travel to a portion of the condenser 130 that is coupled to the heat sink 150. The heat sink 150 may, for example, be a heat sink and/or radiator configured to expel and/or dissipate heat. In the case that the heat sink 150 comprises fins (not shown in FIG. 1) for dissipating heat, for example, the heated vapor may transfer heat (e.g., via the condenser 130) to the fins of the heat sink 150. The cooling of the vapor (i.e., the transfer of heat from the vapor to the heat sink 150) may cause the vapor to phase change back into a liquid form. The liquid may then, for example, flow back to the evaporator 110 to continue the cycle of passive cooling.

In some configurations, the evaporator 110 and/or the condenser 130 may comprise a heat pipe 160. The heat pipe 160 may, for example, be a typical heat pipe used to remove heat from the electronic device 102. In some configurations, multiple heat pipes 160 may be utilized to remove heat from the electronic component 102. The multiple heat pipes 160 may, for example, be configured to transfer heat to a core of the heat sink 150. The heat sink 150 may define a hollow core (not shown), for example, in which the various heat pipes 160 (and/or condensers 130 thereof) are at least partially disposed. Several heat pipe condensers 130 may, in some configurations, be coupled together to fit within and/or transfer heat to the hollow core of the heat sink 150. In some embodiments, such as in the case that the heat pipe 160 comprises a typical heat pipe, the condenser 130 and the evaporator 110 may be or include the same component or device. Typical heat pipes 160 may not, for example, comprise a separate evaporator 110.

Figure 2A:
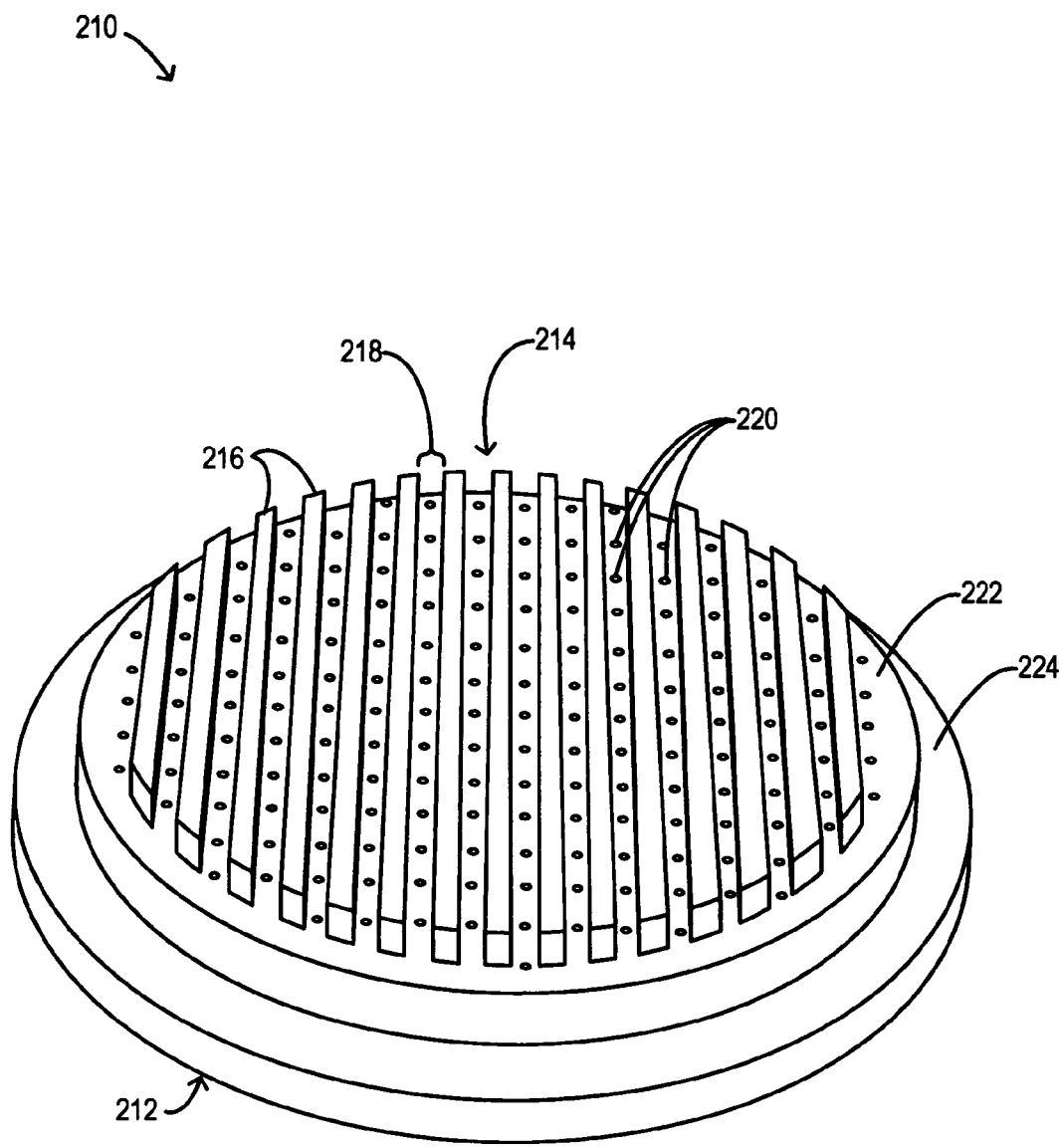
FIG. 2A is a perspective diagram of an evaporator according to some embodiments.
Figure 2B:
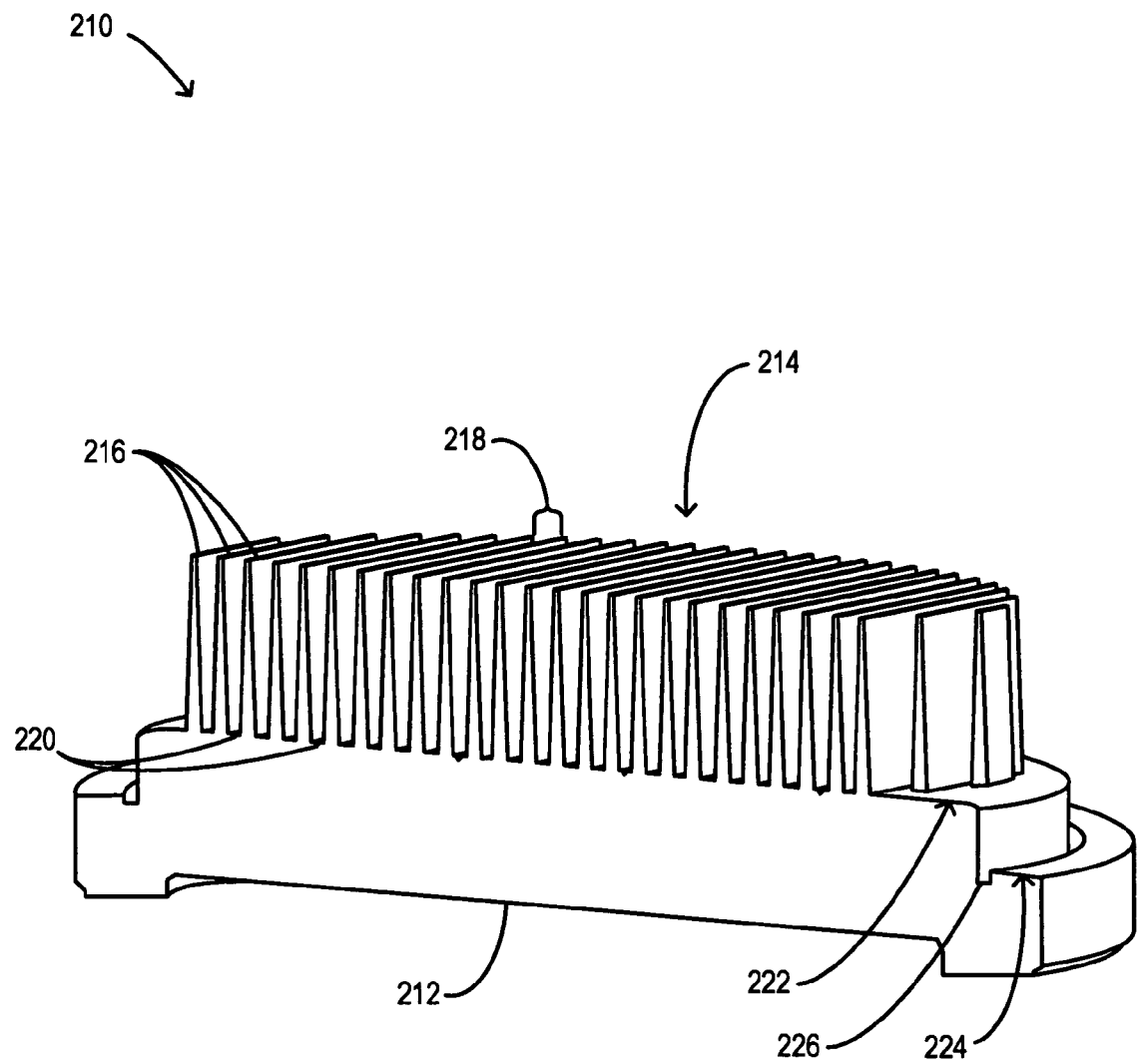
FIG. 2B is a perspective cross-sectional diagram of an evaporator according to some embodiments.

Turning to FIG. 2A and FIG. 2B, a perspective diagram of an evaporator 210 and a perspective cross-section of the evaporator 210 according to some embodiments are shown, respectfully. In some embodiments, the evaporator 210 may be similar to the evaporator 110 described in conjunction with FIG. 1. The evaporator 210 may, for example, be configured to remove heat from an electronic component and/or transfer heat to a liquid in contact with the evaporator 210. In some embodiments, the evaporator 210 may comprise a first side 212 to accept heat and/or a second side 214 to provide heat. The second side 214 may, according to some embodiments, comprise one or more fins 216 defining one or more gaps and/or channels 218 there between. In some embodiments, the channels 218 may comprise one or more nucleation features 220 to facilitate phase change of a liquid in contact with the second side 214. The evaporator 210 may also or alternatively comprise a first area 222 and/or a second area 224 to couple to a condenser and/or other cooling system component. In some embodiments, fewer or more components than are shown in FIG. 2A and/or FIG. 2B may be included in the evaporator 210.

The evaporator 210 may, according to some embodiments, be coupled to a heat source and/or an electronic device or component such as the electronic device 102 (not shown in FIG. 2A or FIG. 2B). The first side 212 of the evaporator 210 may, for example, be coupled to a processor and/or other electronic component. In some embodiments, the evaporator 210 may be constructed of a material such as copper that facilitates heat conduction from the first side 212 to the second side 214 of the evaporator 210. Heat transferred from an electrical component to the first side 212 may, for example, be conducted through the evaporator 210 to the second side 214 (and/or to other areas of the evaporator 210). In some embodiments, the second side 214 may be in contact with a liquid (not shown). The second side 214 may, for example, transfer heat into the liquid to cause the liquid to boil and/or otherwise undergo a phase change. According to some embodiments, the fins 216 on the second side 214 may increase the surface area of the second side 214, increasing the amount of liquid that may be substantially simultaneously heated by the second side 214 of the evaporator 210. In other words, the fins 216 may allow for more uniform and/or efficient heat transfer from the second side 214 of the evaporator 210 into the liquid.

In some embodiments, the gaps and/or channels 218 formed between adjacent fins 216 may be configured to further facilitate transfer of heat to the fluid and/or to facilitate phase change of the liquid. For example, the fins 216 may be closely spaced, causing the channels 218 to be substantially narrow. According to some embodiments, the channels 218 may be substantially four tenths of a millimeter to one and a half millimeters wide. The narrow width of the channels 218, according to some embodiments, may reduce evaporation resistance by, for example, facilitating the formation of smaller vapor bubbles within the liquid and/or by substantially limiting the formation of larger vapor bubbles. The fins 216 and/or the channels 218 may also or alternatively reduce the occurrence of adverse temperature gradients and/or reduce the temperature difference required to cause vapor bubble formation.

According to some embodiments, the fins 216 and/or the channels 218 may also or alternatively facilitate the transportation of liquid to, from, within, and/or upon the evaporator 210. In the case that the channels 218 are substantially straight, parallel, and/or narrow, for example, the channels 218 may facilitate capillary wicking of the liquid toward the central portions (e.g., the hottest portions) of the evaporator 210. In some embodiments, the wicking may occur regardless of the orientation of the evaporator 210 with respect to gravitational forces. Even if the channels 218 are oriented vertical with respect to gravity, for example, the narrowness of the channels 218 may allow liquid to be wicked via capillary action across the surface of the second side 214 of the evaporator 210. According to some embodiments, the channels 218 may also or alternatively by oriented parallel to any gravitational forces to facilitate liquid transportation.

According to some embodiments, the evaporator 210 and/or the channels 218 may also or alternatively comprise the nucleation features 220. The nucleation features 220 may, for example, be or include detents or depressions within the channels 218. In some embodiments, the nucleation features 220 may comprise one or more conical depressions within the channels 218. According to some embodiments, the nucleation features 220 may expose adjacent liquid to higher temperatures to facilitate vapor bubble formation and/or may provide a site for vapor bubbles to form. In some embodiments, any number, type, and/or configuration of nucleation features 220 may be included on the evaporator 210 and/or on the second side 214 thereof. Fewer or more nucleation features 220 than are shown in FIG. 2A and/or FIG. 2B may, for example, be included on the evaporator 210 according to some embodiments.

In some embodiments, the evaporator 210 may also or alternatively comprise the first area 222 and/or the second area 224 to couple the evaporator 210 to a condenser and/or other cooling system component. The first area 222 may, for example, be a portion of the second side 214 that is not impeded upon by the fins 216. The first area 222 may, in some embodiments, be utilized to couple to one or more features of a condenser. Similarly, the second area 224 may be configured to couple to a condenser. A wall and/or surface of a condenser may, for example, be coupled to the substantially planar surfaces defined by the first and/or second areas 222, 224. In some embodiments, any number and/or type of bonding and/or fastening agents may also or alternatively be coupled to the areas 222, 224. An adhesive, solder, thermal interface material, fastener, O-ring, and/or other device may, for example, be coupled to the areas 222, 224 and/or between the areas 222, 224 and a condenser and/or other cooling system component to facilitate coupling of the condenser and/or component to the evaporator 210.

According to some embodiments, such as that shown in FIG. 2B, a groove 226 and/or other feature may be included on either or both of the areas 222, 224. The groove 226 may, for example, be configured to accept an O-ring and/or other fastener to facilitate coupling of the evaporator 210 to a condenser and/or to create a seal there between. In some embodiments, the seal created between the evaporator 210 and the condenser may be or include a hydraulic and/or hermetic seal to substantially contain the liquid within the area adjacent to the second side 214 of the evaporator 210 (e.g., within a cavity defined by the evaporator 210 and/or the condenser). According to some embodiments, any size and/or shape of evaporator 210 may be utilized. In other words, although the evaporator 210 shown in FIG. 2A and FIG. 2B defines a circular and/or disk shape, other shapes and/or configurations may also or alternatively be utilized in accordance with some embodiments.

Figure 3A:
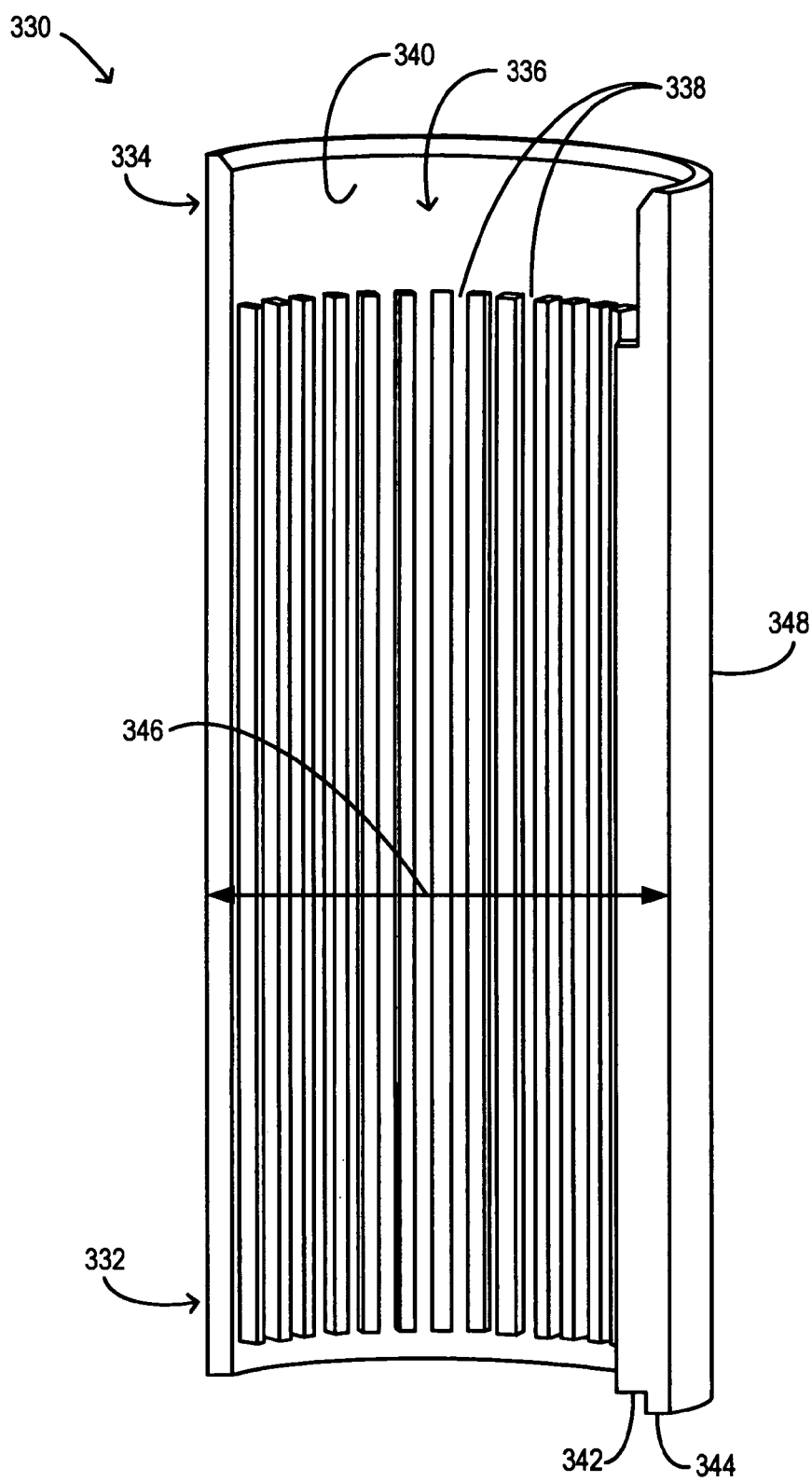
FIG. 3A is a perspective cross-sectional diagram of a condenser according to some embodiments.
Figure 3B:
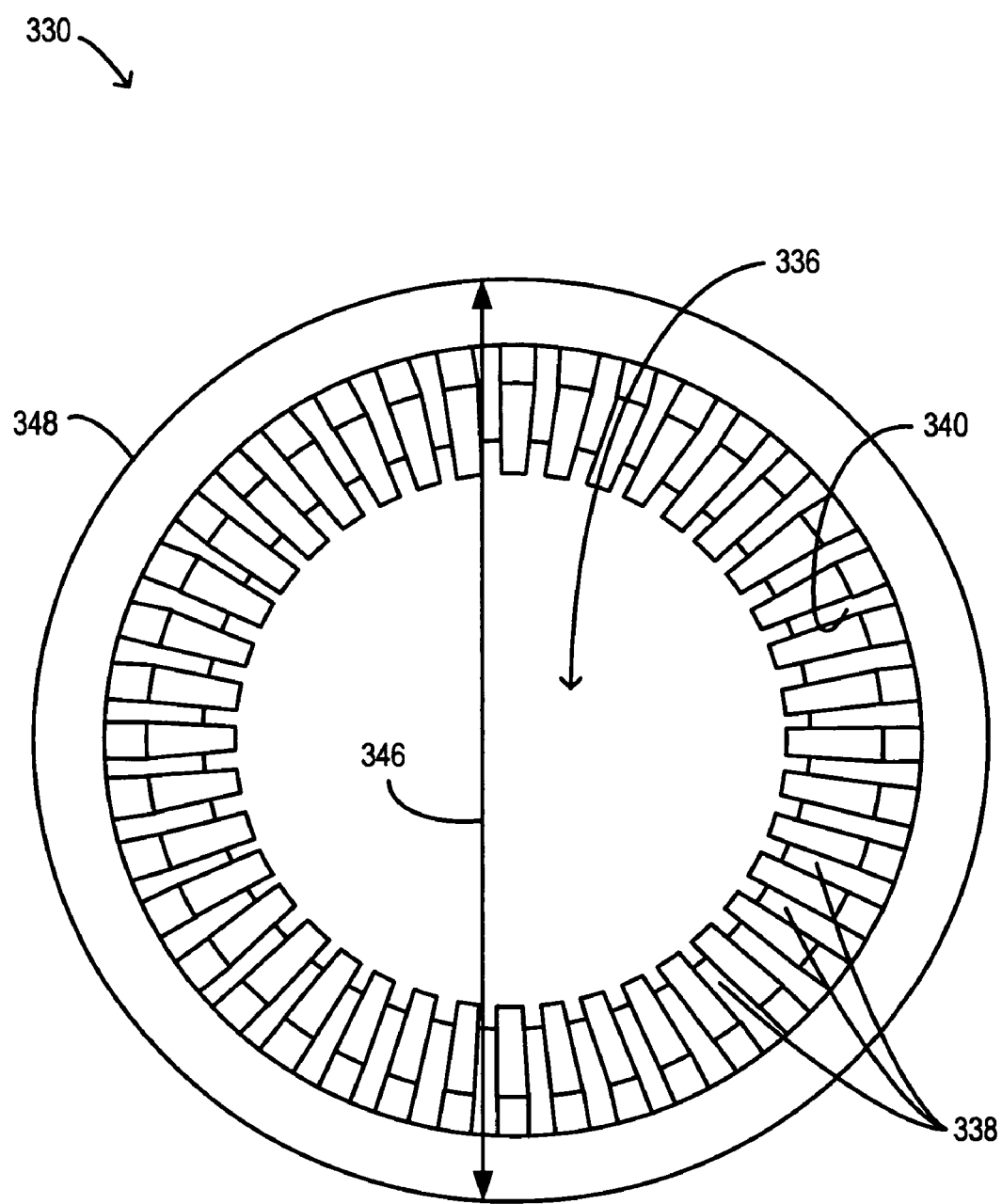
FIG. 3B is a perspective end-view of a condenser according to some embodiments.

Referring now to FIG. 3A and FIG. 3B, a perspective cross-sectional diagram of a condenser 330 and a perspective end-view of the condenser 330 according to some embodiments are shown, respectively. In some embodiments, the condenser 330 may be similar to the condenser 130 described in conjunction with FIG. 1. The condenser 330 may comprise, in some embodiments, a first end 332 and/or a second end 334. According to some embodiments, the condenser 330 may also or alternatively define a cavity 336. In some embodiments, one or more grooves 338 may be disposed within the cavity 336. The grooves 338 may, for example, be disposed upon an inner wall 340 of the condenser 330. According to some embodiments, the condenser 330 may also or alternatively comprise a first area 342 and/or a second area 344, either or both of which may be utilized to couple the condenser 330 to an evaporator and/or other cooling system component. In some embodiments, the condenser 330 may define a width and/or diameter 346 and/or may comprise an outer wall 348. In some embodiments, fewer or more components than are shown in FIG. 3A and/or FIG. 3B may be included in the system 300.

In some embodiments, the condenser 330 may contain a liquid (not shown) within the cavity 336. The liquid may, for example, be heated by an evaporator such as the evaporator 110, 210 (not shown in FIG. 3A or FIG. 3B) near the first end 332 of the condenser 330. The evaporator may, according to some embodiments, be coupled to the first end 332 of the condenser 330. The first area 342 and/or the second area 344 may, for example, be coupled to one or more areas and/or portions of the evaporator. In some embodiments, the evaporator may be coupled to the condenser 330 to form a seal of the cavity 336 near the first end 332. The seal may, for example, facilitate retention of the liquid within the cavity 336. In some embodiments (although not shown in FIG. 3A), the cavity 336 may also or alternatively be sealed near the second end 334 of the condenser 330.

The fluid heated by the evaporator near the first end 332 of the condenser 330 may undergo a phase change to vapor as a result of being heated. According to some embodiments, such as in the case that the condenser 330 is oriented vertically with respect to gravity, the vapor may rise through a central portion of the cavity 336 toward the second end 334 of the condenser 330. In some embodiments, the vapor may be cooled as it travels along the length of the condenser 330. For example, the outer wall 348 of the condenser 330 may be disposed within a cavity of a heat sink (not shown) and/or may comprise one or more fins coupled thereto (also not shown). The condenser 330 (and/or the second end 334 thereof) may, according to some embodiments, be air cooled and/or may otherwise remove heat from the vapor. In some embodiments, the heat sink may also or alternatively seal the second end 334 of the condenser 330 to substantially prevent the liquid from leaking from the cavity 336.

The cooled vapor may, in some embodiments, change phases back into a liquid and may travel back to the first end 332 of the condenser 330. According to some embodiments, the liquid may flow through the grooves 338. In the case that the condenser 330 is oriented vertically with respect to gravity, for example, the grooves 338 may provide vertical channels in which the liquid may condense (e.g., from the vapor state) and/or through which the liquid may flow toward the first end 332 (e.g., back to the evaporator). In some embodiments, the grooves 338 may be milled, cut, and/or otherwise incorporated into the inner wall 340 of the condenser 330. According to some embodiments, the grooves 338 may be defined by one or more projections, fins, and/or other features coupled to the inner wall 340 of the condenser 330.

In some embodiments, the grooves 338 may facilitate the separation of the vapor flow toward the second end 334 and the liquid flow back toward the first end 332 of the condenser 330. In other words, the grooves 338 may provide for more efficient cooling by reducing the interference between the bi-directional fluid flows within the cavity 336. The separation of flows may occur regardless of the orientation of the condenser 330 with respect to gravity. In the case that the condenser 330 is oriented horizontally with respect to gravity, for example, the vapor may travel through the central portion of the cavity 336 and/or through one or more of the higher elevation grooves 338, while the liquid may travel through the lower elevation grooves 338 and/or through one or more of the higher elevation grooves 338. In some embodiments, the grooves 338 may be configured to provide capillary action to wick the liquid back toward the first end 332. In such a manner, for example, the liquid may flow even through grooves 338 oriented inversely to gravity (e.g., in which liquid may otherwise drip out of). In some embodiments, the liquid may flow through the grooves 338 while the vapor may flow through the central and/or other portions of the cavity 336.

According to some embodiments, the diameter 346 of the condenser 330 may also or alternatively be configured to provide for increased cooling efficiency. For example, the diameter 346 of the condenser 330 may be substantially larger than that of a typical heat pipe. In some embodiments for example, the diameter 346 of the condenser 330 may be about ten to forty millimeters (as opposed to about four to ten millimeters for typical heat pipes). According to some embodiments, the large diameter 346 of the condenser 330 may facilitate the separation of fluid flow paths within the cavity 336 and/or may promote more effective cooling of the condenser 330 and/or the vapor. The large diameter 346 condenser 330 may, for example, be at least partially disposed within a hollow core of a heat sink (not shown) to transfer heat to the core of the heat sink.

The single large diameter 346 condenser 330 may, in some embodiments, replace a typical arrangement of multiple heat pipes coupled to transfer heat to the core of a heat exchanger. The single large diameter 346 condenser 330 may be more efficient than typical heat pipe utilization by increasing the amount of surface area utilized to transfer heat to the heat sink and/or by reducing the necessity for bonding of multiple heat pipes that creates increased thermal resistance. Similarly, in the case that fins (not shown) are coupled to remove heat from the condenser 330, the larger diameter 346 may provide a larger area to which the fins may be coupled. The increased coupling area may, for example, increase the number of fins that may be coupled to the condenser 330 and accordingly increase the thermal efficiency of the condenser 330.

Figure 4:
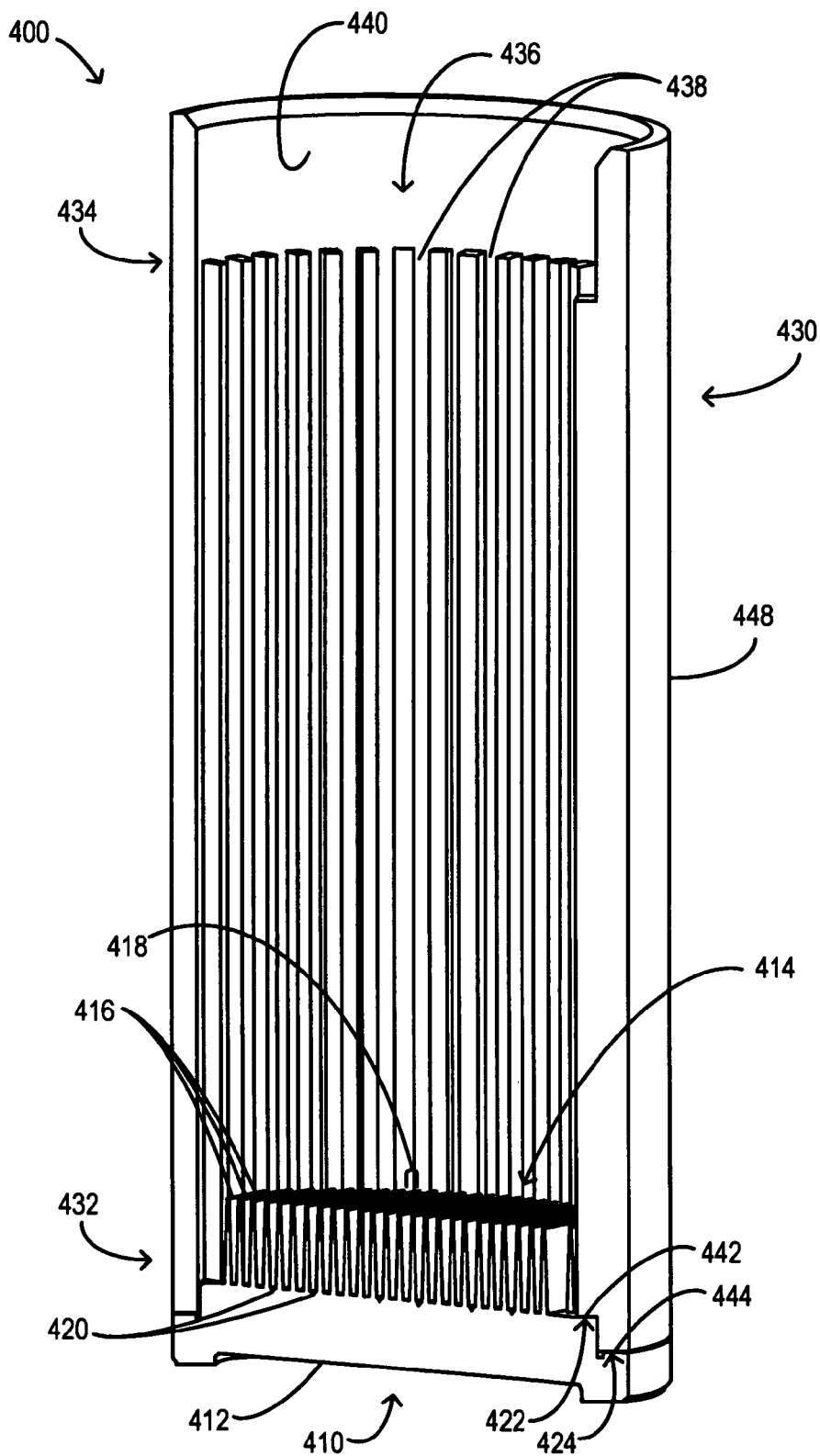
FIG. 4 is a perspective cross-sectional diagram of a system according to some embodiments.

Turning now to FIG. 4, a perspective cross-sectional diagram of a system 400 according to some embodiments is shown. In some embodiments, the system 400 may be or include a cooling solution such as a passive liquid cooling system. The system 400 may comprise, for example, an evaporator 410. The evaporator 410 may comprise a first side 412 to receive heat, a second side 414 to provide heat, one or more fins 416, one or more channels 418, one or more nucleation features 420, and/or a first area 422 and/or a second area 424. In some embodiments, the system 400 may also or alternatively comprise a condenser 430. The condenser 430 may comprise a first end 432 and/or a second end 434.

The condenser 430 may also define a cavity 436 and/or comprise one or more grooves 438 disposed on an inner wall 440. The condenser 430 may also or alternatively comprise a first area 442 and/or a second area 444 to couple to the evaporator 410, and/or an outer wall 448 to transfer heat from the condenser 430. According to some embodiments, the components 410, 412, 414, 416, 418, 420, 422, 424, 430, 432, 434, 436, 438, 440, 442, 444, 448 of the system 400 may be similar in configuration and/or functionality to the similarly-named components described in conjunction with any of FIG. 1, FIG. 2A, FIG. 2B, FIG. 3A, and/or FIG. 3B. In some embodiments, fewer or more components than are shown in FIG. 4 may be included in the system 400.

In some embodiments, the system 400 may be configured to remove heat from an electrical component and/or device (not shown in FIG. 4). The evaporator 410, for example, may be coupled to receive heat from the electrical device via the first side 412 of the evaporator 410. The heat received via the first side 412 of the evaporator 410 may then, for example, be conducted through the evaporator 410 to the second side 414. The second side 414 may, as shown in FIG. 4 for example, be disposed (at least partially) within the cavity 436. According to some embodiments, a liquid (not shown) may also or alternatively be disposed within the cavity 436. The liquid may, for example, receive heat from the second side 414 of the evaporator 410.

According to some embodiments, the second side 414 of the evaporator may include the fins 416 and/or the channels 418. The heat received from the electrical device may, for example, be more efficiently transferred to the liquid via the fins 416. In some embodiments, the fins 416 may provide a more uniform temperature gradient within the liquid in contact with the evaporator 410. The channels 418 between the fins 416 may, according to some embodiments, be relatively narrow (e.g., the fins 416 may be closely spaced). The narrow channels 418 may, for example, promote small vapor bubble growth, increasing the phase change efficiency of the liquid. In some embodiments, the nucleation features 420 may also or alternatively promote vapor bubble formation and/or reduce the temperature required for vapor bubble formation. The nucleation features 420 may, for example, include conical depressions within the channels 418 that provide sites for vapor bubble nucleation and/or that expose local liquid to higher temperatures from the second side 414 of the evaporator 410.

According to some embodiments, the heated vapor may travel from the second side 414 of the evaporator 410 (and/or from a location near the second side 414) and/or from the first end 432 of the condenser 430 toward the second end 434 of the condenser 430. In some embodiments, the vapor may travel through the central portions of the cavity 436. The vapor may then, for example, be cooled and/or or otherwise condensed near the second end 434 of the condenser 430. The outer wall 448 of the condenser 430 may, for example, be associated with one or more fins and/or other cooling devices capable of receiving heat to cool the second end 434 of the condenser 430. In some embodiments, the outer wall of the condenser 430 may be disposed within a core of a heat sink (not shown) and/or may have one or more fins coupled directly thereto (also not shown).

According to some embodiments, any portion of the outer wall 448 may be associated with cooling the condenser 430 and/or the vapor. The fins and/or heat sink may, for example, extend toward and/or to the first end 432 of the condenser 430. Accordingly, the vapor within the cavity 436 may condense and/or be cooled (e.g., at least partially) in any region of the cavity 436 removed from the second side 414 of the evaporator 410. In some embodiments, some vapor may be cooled, condensed, and/or phase changed back into a liquid along any portion of the inner wall 440. The cooling of the condenser 430 and/or the vapor may, for example, be configured such that substantially the entire vapor is condensed, cooled, and/or phase changed by the time it reaches and/or becomes proximate to the second end 434. According to some embodiments, substantially all of the cooling of the vapor may be performed at and/or near the second end 434 of the condenser 430.

In some embodiments, the condensed and/or cooled vapor may revert to liquid form and may travel back toward the first end 432 of the condenser 430 and/or the second side 414 of the evaporator 410. The liquid may condense, for example, on, within, and/or near the grooves 438 and/or may utilize the grooves 438 to travel back to the evaporator 410. According to some embodiments, the grooves 438 may allow the vapor and liquid flows within the cavity 436 to remain substantially separate. The liquid may travel along the inner wall 440 of the condenser 430 and/or within the grooves 438, for example, while the vapor may travel in the central and/or remaining portions of the cavity 436. In some orientations of the system 400, the grooves 438 may provide capillary action to transport the liquid back to the evaporator 410. Similarly, the fins 416 and/or channels 418 of the evaporator 410 may provide capillary action transport to the liquid to facilitate the return of the liquid to the second side 414 of the evaporator 410.

The condenser 430 and the evaporator 410 may be coupled in any manner that is or becomes known or practicable. In some embodiments, the first and/or second areas 422, 424 of the evaporator 410 may be coupled to the first and/or second areas 442, 444 of the condenser 430, respectively. For example, the first area 442 of the condenser 430 may be or include an area between adjacent grooves 438. In some embodiments, such as in the case that the grooves 438 are formed between projections from the inner wall 440, the first area 442 may be or include the end area of the projections that may be coupled to the first area 422 of the evaporator 410. In other words, the grooves 438 may extend substantially from the first end 432 to the second end 434 of the condenser 430 and/or may extend toward the bottom and/or base of the fins 416. According to some embodiments, the grooves 438 may extend to the top of the fins 416 and/or the first area 442 may not be coupled to the first area 422 of the evaporator 410.

In some embodiments, the grooves 438, fins 416, channels 418, and/or nucleation features 420 may be configured in any manner that is or becomes known or practicable. The fins 416 may not cover the entire second side 414 of the evaporator 410, for example, and/or the grooves 438 may only be provided on a portion of the inner wall 440. In some embodiments, fewer or more grooves 438, fins 416, channels 418, and/or nucleation features 420 than are shown in FIG. 4 may be provided in the system 400.

Figure 5:
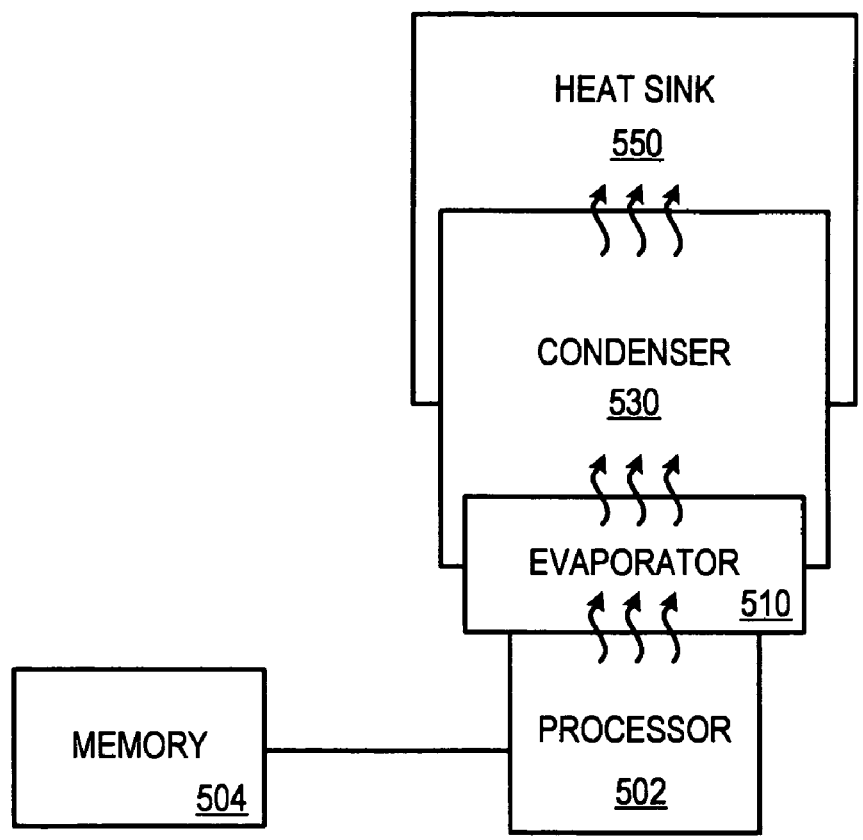
FIG. 5 is a block diagram of a system according to some embodiments.

Turning to FIG. 5, a block diagram of a system 500 according to some embodiments is shown. In some embodiments, the system 500 may be similar to the systems 100, 400 described in conjunction with any of FIG. 1 and/or FIG. 4. The system 500 may comprise, for example, a processor 502, a memory 504, an evaporator 510, a condenser 530, and/or a heat sink 550. According to some embodiments, the components 502, 510, 530, 550 of the system 500 may be similar in configuration and/or functionality to the similarly-named components described in conjunction with any of FIG. 1, FIG. 2A, FIG. 2B, FIG. 3A, FIG. 3B, and/or FIG. 4. In some embodiments, fewer or more components than are shown in FIG. 5 may be included in the system 500.

The processor 502 may be or include any number of processors, which may be any type or configuration of processor, microprocessor, and/or micro-engine that is or becomes known or available. In some embodiments, other electronic and/or electrical devices may be utilized in place of or in addition to the processor 502. The processor 502 may, for example, be or include any device, object, and/or component that generates, stores, and/or requires removal of heat. According to some embodiments, the processor 502 may be an XScale® Processor such as an Intel® PXA270 XScale® processor.

The memory 504 may be or include, according to some embodiments, one or more magnetic storage devices, such as hard disks, one or more optical storage devices, and/or solid state storage. The memory 504 may store, for example, applications, programs, procedures, and/or modules that store instructions to be executed by the processor 502. The memory 504 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

In some embodiments, the processor 502 may generate heat while executing instructions stored by the memory 504. According to some embodiments, this heat may need to be removed from the processor 502 to allow the processor 502 to function properly and/or to prevent thermal damage to the processor 502. In some embodiments, the evaporator 510 may be coupled to remove heat from the processor 502. The evaporator 510 may, for example, transfer the heat to a liquid within a cavity (not shown in FIG. 5) defined by the evaporator 510 and/or the condenser 530. The evaporator 510 may, in some embodiments, include fins, channels, and/or nucleation features (not shown in FIG. 5) to facilitate the transfer of heat to the liquid. The liquid may be caused to boil and/or evaporate due to the heat exchange and may flow (e.g., as a vapor) away from the processor 502 and/or the evaporator 510.

The condenser 530 may, according to some embodiments, be at least partially disposed within the heat sink 550. The vapor, upon reaching an area of the condenser 530 proximate to the heat sink 550, for example, may be cooled and/or condensed back into a liquid form. In some embodiments, the vapor may transfer heat through the condenser 530 and into the heat sink 550. The heat sink 550 may then, for example, dissipate and/or remove the heat for the condenser 530. In some embodiments, the heat sink 550 may be or include any type of heat exchanger that is or becomes known or practicable. The heat sink 550 may, for example, be a typical finned, air-cooled heat exchanger. According to some embodiments, the heat exchanger 550 may be coupled to and/or incorporated onto the condenser 530. The condenser 530 may, for example, comprise one or more fins (not shown) to facilitate cooling to the vapor.

In some embodiments, any or all of the cooling components 510, 530, 550 may be or include components similar to those described herein. According to some embodiments, one or all of the cooling components 510, 530, 550 may also or alternatively comprise one or more conventional devices to perform the required functionality of the particular component. As an example, the heat sink 550 may, in some embodiments, be a typical heat sink and/or radiator device. In some embodiments, the heat sink 550 may comprise and/or define a hollow core to accept heat. The condenser 530 and the evaporator 510 may, for example, comprise a passive liquid cooling core to fill the hollow core of the heat sink and transfer heat thereto. According to some embodiments as described herein, the configuration of the condenser 530 and the evaporator 510 may provide improved heat removal (e.g., from the processor 502 and/or areas proximate thereto) and/or improved efficiency compared to typical passive liquid cooling devices.

The several embodiments described herein are solely for the purpose of illustration. Other embodiments may be practiced with modifications and alterations limited only by the claims.

What is claimed is:

1. A system, comprising:
   an evaporator, comprising:
      a first side to receive heat from a processor;
      a second side; and
      one or more fins protruding from the second side; and
   a condenser, comprising:
      an inner surface defining a cavity and one or more grooves;
      a first end coupled to the evaporator such that the one or more fins of the evaporator are disposed within the cavity; and
      a second end, wherein the one or more grooves extend at least partially between the first and second ends of the condenser, wherein the evaporator is to be coupled to a top and to at least one side of the processor.

2. The system of claim 1, wherein the one or more fins are substantially parallel.

3. The system of claim 1, wherein the one or more fins are spaced to form one or more channels between adjacent fins.

4. The system of claim 3, wherein the one or more channels are approximately 0.4-mm to 1.5-mm wide.

5. The system of claim 3, wherein one or more detents are disposed within the one or more channels.

6. The system of claim 5, wherein the one or more detents comprise one or more substantially conical depressions in a floor of the channels between adjacent fins.

7. The system of claim 1, wherein the condenser comprises a length dimension extending between the first and second ends of the condenser and a width dimension perpendicular to the length dimension, wherein the width dimension is approximately 10-mm to 40-mm.

8. The system of claim 1, wherein the first side comprises a top portion and a side portion, the side portion below the top portion.

9. The system of claim 1, further comprising:
   a heat sink coupled to the condenser.

10. The system of claim 1, wherein the second side comprises:
    a first area not impeded by the one or more fins;
    a second area below the first area; and
    a coupling groove defined by the first area and the second area,
    wherein the coupling groove is located between the first area and the second area, wherein the groove is closer to the second area than the first area and the first side, and wherein the condenser is to be coupled to the first area and the second area.

11. The system of claim 9, wherein the heat sink is a radial heat sink, the condenser is substantially cylindrical, and the evaporator is disk-shaped.

12. A system, comprising:
    a processor;
    a double data rate memory in communication with the processor;
    an evaporator, comprising:
       a first side to receive heat from the processor;
       a second side; and
       one or more fins protruding from the second side; and
    a condenser, comprising:
       an inner surface defining a cavity and one or more grooves;
       a first end coupled to the evaporator such that the one or more fins of the evaporator are disposed within the cavity; and
       a second end, wherein the one or more grooves extend at least partially between the first and second ends of the condenser, wherein the evaporator is to be coupled to a top and to at least one side of the processor.

13. The system of claim 12, further comprising:
    a heat sink coupled to remove heat from the condenser.

14. The system of claim 12, wherein the second side comprises:
    a first area not impeded by the one or more fins;
    a second area below the first area; and
    a coupling groove defined by the first area and the second area,
    wherein the coupling groove is located between the first area and the second area, wherein the groove is closer to the second area than the first area and the first side, and wherein the condenser is to be coupled to the first area and the second area.

15. The system of claim 13, wherein the first side comprises a top portion and a side portion, the side portion below the top portion.

16. The system of claim 13, wherein the heat sink is a radial heat sink, the condenser is substantially cylindrical, the cavity of the condenser is substantially cylindrical, and the evaporator is substantially disk-shaped.

17. The system of claim 12, wherein the one or more fins are substantially parallel.

18. The system of claim 12, wherein the one or more fins are spaced to form one or more channels between adjacent fins.

19. The system of claim 18, wherein one or more detents are disposed within the one or more channels.

* * * * *